United States Patent [19]
Gentile et al.

[11] Patent Number: 4,613,495
[45] Date of Patent: Sep. 23, 1986

[54] GROWTH OF SINGLE CRYSTAL CADMIUM-INDIUM-TELLURIDE

[75] Inventors: Anthony L. Gentile, Thousand Oaks; Nanse R. Kyle, Topanga; Fred W. Hill, Thousand Oaks, all of Calif.

[73] Assignee: Hughes Aircraft Company, Los Angeles, Calif.

[21] Appl. No.: 632,982

[22] Filed: Jul. 20, 1984

[51] Int. Cl.$^4$ .................. C01B 19/00; C30B 29/46
[52] U.S. Cl. .................. 423/508; 156/616 R; 156/624; 156/DIG. 70; 156/DIG. 72
[58] Field of Search ............ 156/616 R, 617 V, 619, 156/624, DIG. 70, DIG. 72, DIG. 98; 423/508, 624; 252/62.3 S, 62.3 V, 62.3 ZT; 75/65 ZM

[56] References Cited

U.S. PATENT DOCUMENTS

| | | | |
|---|---|---|---|
| 1,793,672 | 2/1931 | Brigman | 156/616 R |
| 3,060,065 | 10/1962 | Orem | 156/616 R |
| 3,622,399 | 11/1971 | Johnson | 156/616 R |
| 4,011,074 | 3/1977 | Dietl et al. | 156/617 V |
| 4,141,777 | 2/1979 | Matveev et al. | 156/616 R |

FOREIGN PATENT DOCUMENTS

| | | | |
|---|---|---|---|
| 1434439 | 5/1976 | United Kingdom | 156/DIG. 72 |
| 2051607 | 1/1981 | United Kingdom | 156/617 V |

OTHER PUBLICATIONS

A. L. Gentile et al., Melt Growth of Ternary Chalcogenides, Mat. Res. Bull. vol. 4, pp. 869–876, 1969.

*Primary Examiner*—David L. Lacey
*Attorney, Agent, or Firm*—John A. Sarjeant; A. W. Karambelas

[57] ABSTRACT

A method for producing a large high-quality single crystal of Cadmium-Indium-Telluride is disclosed wherein a stoichiometric crystal is produced from a non-stoichiometric melt composition. An initial melt composition corresponding to approximately 62 mole % to 90 mole % $In_2Te_3$ and 38 mole % to 10 mole % CdTe, respectively, is prepared and sealed in an evacuated ampoule and then heated to completely melt the mixture. Growth of a single crystal of $CdIn_2Te_4$ is initiated and maintained from the non-stoichiometric melt mixture by lowering the melt through its corresponding phase-equilibrium melting point. Upon cooling to room temperature, the large single crystal so produced is removed from the ampoule.

27 Claims, 1 Drawing Figure

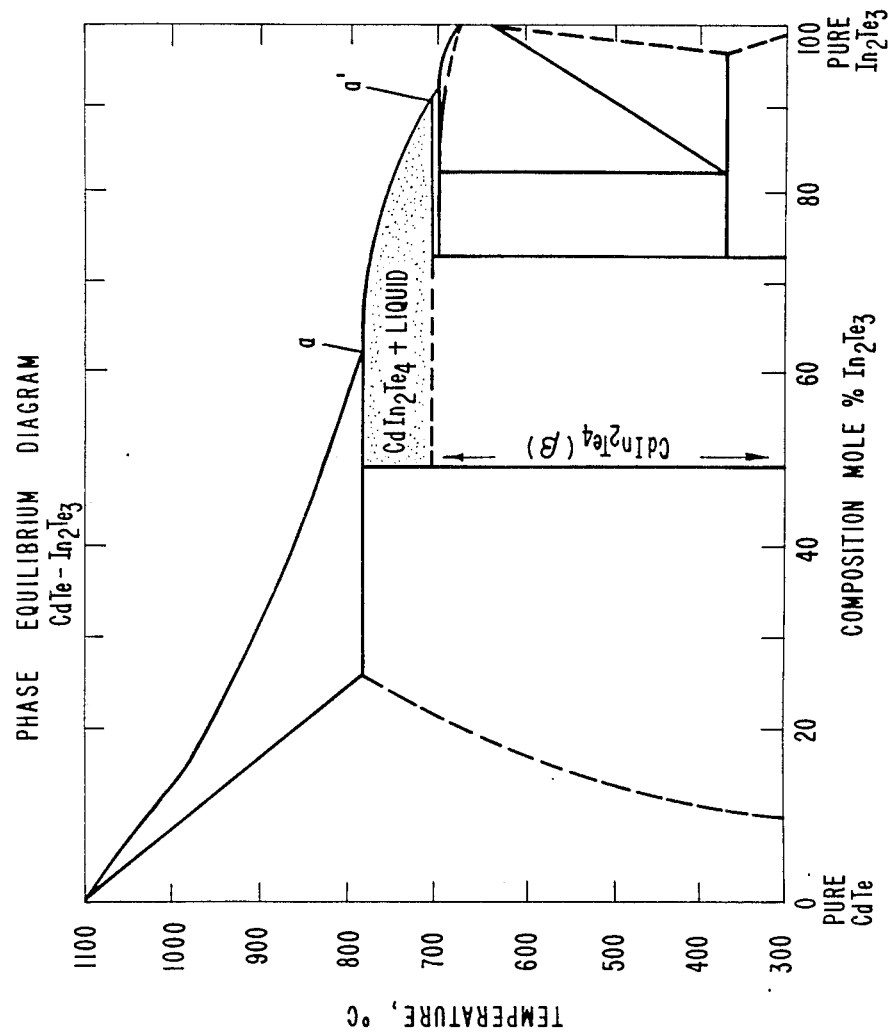

GROWTH OF SINGLE CRYSTAL CADMIUM-INDIUM-TELLURIDE

RIGHTS OF THE UNITED STATES GOVERNMENT

The Government has rights in this invention pursuant to Contract No. F19628-81-C-0081, awarded by the Department of the Air Force.

BACKGROUND OF THE INVENTION

The present invention relates to a method of producing a ternary chalocogenide single crystal. More particularly, the present invention is directed to a method of growing large, high-quality single crystals of Cadmium-Indium-Telluride ($CdIn_2Te_4$) using an off-stochiometric melt based on the phase equilibrium relationship in the system $CdTe-In_2Te_3$. The method of the present invention produces large high-quality single crystals of $CdIn_2Te_4$ of a size previously unattainable by prior art methods. The crystals so produced have a large electro-optic coefficient and thus are well suited for application in electro-optic devices.

Though prior art methods are known to have been successful at producing Cadmium-Indium-Telluride crystals in the past, such prior art techniques have not been successful at producing crystals of sufficient size or purity for use in electro-optic applications. In fact, prior art crystals have been of insufficient size and quality to even enable researchers to determine the existence and extent of their electro-optic properties. Typically, prior art growth was accomplished by the Czochralski technique wherein a crystal was pulled from a melt of the same composition as the crystal. Because the melt composition is incongruently melting, it is difficult if not impossible to obtain a high-purity crystal free of precipitates through the Czochralski technique. Additionally, the Czochralski method does not incorporate the use of overpressures of the more volatile components of the melt and thus allows loss of these components from the solid growing crystal. As a result, the stoichiometry of the final crystal can change and hence, the electrical and optical properties of the crystal are correspondingly altered as a result.

Accordingly, it is a principal object of the present invention to provide a method for growing large, high-quality single crystals of high-purity $CdIn_2Te_4$ to assure optimum electrical and optical properties. It is a further object of the present invention to provide a method for growing high-quality single crystals of $CdIn_2Te_4$ to previously unattainable dimensions in order to provide crystals of sufficient size for research applications and use in electro-optic devices.

SUMMARY OF THE INVENTION

Generally stated, the present invention accomplishes the above-described objectives by disclosing a method for the growth of ternary chalcogenide single crystals of Cadmium-Indium-Telluride ($CdIn_2Te_4$) based on the phase equilibrium relationships in the Cadmium Telluride (CdTe)-Indium Telluride ($In_2Te_3$) system. The single crystal is grown from a melt composition selected from the phase field of the $CdTe-In_2Te_3$ system wherein solid $CdIn_2Te_4$ exists in equilibrium with the liquid melt.

More particularly, the method of single crystal growth of the present invention utilizes the phase equilibrium relationship of the $Cd-In_2Te_3$ system as originally published by Berger and Prochukan (Ternary Diamond-Like Semiconductors, Consultant's Bureau, New York, 1969, page 83) and is based upon further refinements and modifications of the information disclosed therein.

The method of the present invention utilizes an off-stoichiometric melt for the growth of a large single stoichiometric crystal. Either self-seeding or seed crystal initiation of the crystal growth can be utilized. Briefly, the method of the present invention comprises the steps of:

(a) Preparing a mixture of high-purity Cadmium, Indium and Tellurium corresponding in amount to a mixture of approximately 62 mole % to 90 mole % $In_2Te_3$ and approximately 38 mole % to 10 mole % CdTe, respectively;

(b) Sealing this mixture in a clean, evacuated ampoule provided with a dependant cone-shaped tip when self-seeded crystal growth is desired, or an ampoule wherein the tip has been truncated and a seed crystal implanted within the ampoule at the point of truncation when seed crystal initiated growth is desired;

(c) Melting the mixture by heating the sealed ampoule to a temperature in excess of the mixture's melting point; and (d) Slowly cooling the "melt" so produced down through the melting point of the mixture at a controlled rate to initiate crystal growth at the coneshaped tip of the ampoule or at the implanted seed crystal within the ampoule and to maintain this growth to the completion of the single crystal of $CdIn_2Te_4$ within the sealed ampoule.

It will be appreciated that the mixture may be prepared directly by utilizing the disclosed mole percentages of $In_2Te_3$ and CdTe as well as from the elemental components themselves. To this end, Cadmium and Tellurium can be reacted in a sublimation process (which also acts as a purification step) to form Cadmium Telluride while Indium and Tellurium can be reacted in a melt to form Indium Telluride before combining these resultant materials in the desired proportions of the initial mixture of the melt. Various melt compositions can be utilized to practice the method of the present invention ranging from approximately 62 mole % $In_2Te_3$-38 mole % CdTe to approximately 90 mole % $In_2Te_3$-10 mole % CdTe, with a preferred mixture composition (producing higher yields) of approximately 62 mole % to 75 mole % $In_2Te_3$ and an optimum mixture having approximately 64 mole % $In_2Te_3$ as a melt mixture composition.

The melting point of the mixture so produced will vary with the composition of the mixture and ranges from a high of approximately 785° C. (corresponding to 62% $In_2Te_3$) to a low of approximately 702° C. (corresponding to 90 mole % $In_2Te_3$). In the phase field of the temperature-composition equilibrium diagram for the $CdTe-In_2Te_3$ system defined by these melting temperatures, $CdIn_2Te_4$ has been found to exist in equilibrium with the liquid melt and was discovered to be the first solid phase to grow from the liquid melt. Below approximately 702° C. the mixture was found to rapidly solidify as a polycrystalline mass, this rapid crystallization having no effect on the previously grown single crystal of $CdIn_2Te_3$.

It should be noted that it is possible to supercool these liquid melt mixtures which will result in the rapid crystallization of a polycrystalline material instead of the slow steady growth of a CdIn$_2$Te$_4$ single crystal. Accordingly, it is desirable to lower the temperature of the liquid melt at a relatively slow and controlled rate. As will be discussed in detail below, a preferred embodiment of the present invention using a modification of the Bridgman approach can be utilized to practice the present invention, wherein the cooling rate of the heated ampoule is determined by the rate at which the ampoule is lowered through a vertical furnace having a preset thermal gradient.

Further objects, features and advantages of the present invention will become apparent to those skilled in the art from a consideration of the following detailed description and the accompanying FIGURE.

BRIEF DESCRIPTION OF THE DRAWING

The FIGURE is a temperature-composition phase equilibrium diagram for the Cadmium Telluride (CdTe)-Indium Telluride (In$_2$Te$_3$) system developed from our research and illustrates the principles of the present invention.

DETAILED DESCRIPTION OF THE INVENTION

Referring more particularly to the temperature-composition phase equilibrium diagram of the FIGURE, the method of the present invention produces a large, high-quality single crystal of high-purity CdIn$_2$Te$_4$ by preparing a melt mixture ranging in composition from approximately 62 mole % In$_2$Te$_3$ (38 mole % CdTe) to approximately 90 mole % In$_2$Te$_3$ (10 mole % CdTe). As shown in the CdTe-In$_2$Te$_3$ system of the phase equilibrium diagram, at elevated temperatures ranging between approximately 785° C. and 702° C. (line segment a-a'), crystal CdIn$_2$Te$_4$ exists in equilibrium with the liquid melt for mixtures in this composition range. Accordingly, in the phase field defined by these Indium Telluride-Cadmium Telluride compositions, as the temperature is lowered along line a-a', the first material to crystallize from the liquid melt is stoichiometric CdIn$_2$Te$_4$.

It should be noted at this point that the original CdTe-In$_2$Te$_3$ phase equilibrium relationship published by Berger and Prochukhan disclosed a significant enrichening of In$_2$Te$_3$ in what we have found to be the preferred phase field. This originally disclosed enrichening indicated that it would not be possible to crystallize stoichiometric CdIn$_2$Te$_4$ from the liquid melt in the phase field. However, as shown in the accompanying FIGURE, our revised phase diagram reflects the results of our research wherein the stoichiometric mixture corresponding to CdIn$_2$Te$_4$ is represented by vertical line beta ($\beta$) indicating that such previously disclosed enrichment of In$_2$Te$_3$ does not in fact occur in our system. Accordingly, it was surprisingly discovered that it is possible to produce stoichiometric crystals from an off-stoichiometric melt with the method of the present invention.

Though the method of the present invention will produce the desired single crystal of CdIn$_2$Te$_4$ utilizing melt mixture compositions in the disclosed range of approximately 62 mole % to 90 mole % In$_2$Te$_3$, to obtain a maximum yield of the crystalline Cadmium-Indium-Telluride, the mixture composition should be chosen to be as close as possible to the composition corresponding to stoichimetric CdIn$_2$Te$_4$. Accordingly, a preferred composition mixture in the range of approximately 62 mole % to 75 mole % In$_2$Te$_3$ is disclosed to achieve this desired maximum yield of single crystal. However, it should be appreciated that the use of a stoichiometric melt (corresponding to a mixture composition along vertical line beta of the FIGURE) produces a melt in a different phase field of the temperature-composition phase diagram of the FIGURE and allows a different compound (essentially Indium doped Cadmium Telluride) to be the first solid phase to crystallize out as the temperature is lowered. It will also be appreciated that such a stoichiometric mixture composition has a melting point significantly different than that of the desired melt mixture composition range and hence the stoichiometric mixture is not suitable for practicing the method of the present invention.

Currently, it has been discovered that a mixture composition corresponding to approximately 64 mole % In$_2$Te$_3$ produces a maximum yield of crystalline CdIn$_2$Te$_4$, as this mixture narrowly sidesteps the undesirable different phase field corresponding to the stoichiometric composition melt.

To practice the method of the present invention an appropriate mixture composition is selected within the disclosed approximately 62 mole % to 90 mole % In$_2$Te$_3$ range. The starting materials are the constituent elements of the CdIn$_2$Te$_4$ crystal, namely, Cadmium, Indium and Tellurium of high-purity (minimum purity of approximately 99.999%). At this point it should be noted that there are two possible approaches to preparing the desired mixture. First, the constituent elements may be weighed out and mixed to the desired overall melt composition. Alternatively, a second approach involves reacting Cadmium and Tellurium in a sublimation process to form Cadmium-Telluride and subsequently reacting Indium and Tellurium in a melt reaction to form Indium Telluride and then combining the proper proportions of CdTe and In$_2$Te$_3$ so produced to form a mixture having the desired composition.

Regardless of which approach is utilized to prepare the desired mixture, the next step involves sealing the mixture into a clean evacuated ampoule. Preferably, the ampoule is formed of a fused silica material and is as clean as possible. Cleanliness is a particularly important requirement in order to avoid the formation of undesirable oxides which not only reduce or destroy many of the desired crystal properties, but may also cause the crystal grown to adhere to the internal surfaces of the ampoule. To this end, it is possible to coat the interior surfaces of the ampoule with pyrolytic carbon to prevent such adhesions; however, such a carbon coating is not essential to the method of the present invention.

The ampoule itself is either provided with a dependent cone-shaped tip in order to initiate the growth of the self-seeding single crystal or a truncated tip with a seed crystal implanted in order to initiate growth from a seed crystal. The diameter of said dependent cone-shaped tip ranges between 19–55 mm. The cone-shaped area for growth initiation also functions to reduce the undesirable possibility of supercooling the liquid melt by reducing the thermal mass at the tip of the ampoule that must be cooled to initiate crystal growth. Supercooling (cooling the liquid material below its freezing point without the formation of a solid) occurs in a relatively small temperature range below the melting point of the liquid material and is undesirable because it results in the rapid solidification of a polycrystalline material. Reducing the thermal mass makes it easier to control the cooling rate and to prevent this problem.

Before sealing the mixture in the ampoule, the ampoule containing the mixture is evacuated and treated with a reducing gas such as hydrogen or hydrazene at an elevated temperature on the order of 600° C. to remove any oxygen that may be present on the surfaces of the materials for the reasons stated above. It should be noted that other methods of removing oxygen are also contemplated as being within the scope of the present invention.

In addition to preventing the Cadmium-Indium-Tellurium mixture of the present invention from being exposed to oxygen and other atmospheric contaminants, sealing the mixture into the evacuated ampoule also assures $CdIn_2Te_4$ crystal stoichiometry. Unlike the Czochralski method discussed above, the method of the present invention does not allow loss of the more volatile constituents from the solid growing crystal because the mixture is sealed in an evacuated ampoule with an excess of $In_2Te_3$.

The next step in the method of the present invention involves melting the mixture sealed in the ampoule by heating the ampoule to a temperature in excess of the melting point of the mixture. Again, depending on the composition of the mixture itself, the melting point will range from between approximately 785° C. (for an approximately 62 mole % $In_2Te_3$ initial mixture) to approximately 702° C. (for an approximately 90 mole % $In_2Te_3$ mixture). To ensure complete melting and a proper equilibrium in the desired phase field, the ampoule is preferably heated to a temperature in excess of the melting point of the mixture. Recommended temperatures for this purpose are on the order of approximately 785° C. to approximately 900° C. or beyond. However, heating the ampoule beyond 900° C. is not necessary to practice the method of the invention.

Once the mixture has been melted, the temperature of the sealed ampoule is lowered through the melting point of the mixture which, as discussed above, lies on the curved designated by a-a' in the phase diagram of the FIGURE and correponds to the melt composition. To avoid supercooling the melt liquid, the temperature is reduced slowly to initiate $CdIn_2Te_4$ crystal nucleation and growth at the cone-shaped tip of the sealed ampoule. A preferred method of temperature reduction is to lower the ampoule, tip first, through a decreasing temperature gradient. As the single crystal grows in the ampoule, the composition of the melt mixture changes and becomes enriched in $In_2Te_3$. As shown in the FIGURE, this will result in a corresponding drop in the melting point of the mixture along line a-a' at which the solid $CdIn_2Te_4$ crystal exists in equilibrium with the liquid melt. Thus, by continuing to slowly lower the temperature of the liquid melt, the growth of the single stoichiometric $CdIn_2Te_4$ crystal is maintained while the composition of the remaining liquid melt is correspondingly depleted in CdTe. When the remaining liquid melt reaches the temperature of approximately 702° C., it is rapidly solidified as a polycrystalline mass of material rich in $In_2Te_3$. This rapid solidification has no effect on the previously grown single crystal of $CdIn_2Te_4$. Cooling of the solidified crystal is continued until room temperature is reached whereupon the crystal can be removed from the ampoule.

While any method of heating the sealed ampoule to melt the mixture can be utilized to practice the method of the present invention, a particularly convenient method of heating the ampoule incorporates a modified vertical Bridgman approach wherein a vertical resistance heated furnace is utilized to heat the ampoule. The ampoule is loaded into the resistance furnace with the dependent cone-shaped tip pointing downward. The furnace is calibrated to have a relatively flat thermal profile over the 900° C. to 785° C. temperature range and a relatively steep thermal gradient over the 785° C. to 600° C. temperature range. Use of such a temperature profile facilitates removal of the heat of crystallization during the $CdIn_2Te_4$ crystal growth which occurs between 785° C. and 702° C. The process conditions required for crystal growth depend on the composition of the crystal growth mixture and the size (diameter) of the ampoule in which the crystal is grown. By way of example, for a 76 mm bore tube furnace with a thermal gradient during the crystal growth phase (785° C.–702° C.) ranging between about 1.1° C. and about 3.5° C. per millimeter of furnace travel, the ampoule is preferably lowered through the furnace thermal gradient at a constant rate ranging between about 0.05 mm/hr. to 0.6 mm/hr., depending on the ampoule diameter. Once the entire melt has solidified the crystal can be cooled to room temperature more rapidly, preferably at rates on the order of approximately 0.5° C./hr. to 5.0° C./hr. The vertical resistance heated furnace is preferred because it simplifies and facilitates the melting and subsequent cooling of the crystal forming mixture at the preferred rates. However, it should again be emphasized that other methods of heating and cooling the mixture within the sealed ampoule are contemplated as being within the scope of the present invention.

Once cooled to a temperature at which the crystal containing ampoule can be conveniently handled, the crystal can be removed from the ampoule in a number of ways. The fused silica ampoule can be dissolved in hydrofluoric acid or the ampoule can simply be scored and fractured to remove it from the crystal contained therein.

The following are detailed examples for growing a large high-quality single crystal of $CdIn_2Te_4$ according to the method of the present invention.

EXAMPLE 1

An initial melt mixture corresponding to 63 mole % $In_2Te_3$ and 37 mole % CdTe was prepared in the following manner. One hundred thirty-two and eight-tenths (132.8) grams of high-purity $In_2Te_3$ was mixed with 30.6 grams of CdTe, both compounds having been prepared and purified as discussed above. The mixture so prepared was sealed in a clean, evacuated fused silica ampoule approximately 19 mm in diameter. The sealed ampoule was lowered into a 76 mm bore vertical resistance heated furnace previously calibrated to provide a relatively flat thermal profile of 883° C. throughout the mixture heating and melting zone of the furnace. After the mixture had melted within the sealed ampoule, the ampoule was lowered through the thermal gradient section of the furnace. The furnace thermal gradient over the crystal growth section of the furnace (785° C.–702° C.) ranged from about 1.2° C./mm furnace travel at 785° C. to about 2.9° C./mm furnace travel at 702° C. The ampoule was lowered through the thermal gradient at a rate of about 0.504 mm/hr. until completion, at which point the remaining liquid melt composition rapidly solidified as a polycrystalline mass. The ampoule was slowly cooled, at a rate between about 0.5° C./hr. and 5° C., to room temperature, whereupon the crystal was removed from the ampoule. A large high-quality single crystal of CdIn$_2$Te$_4$ having a diameter of about 16 mm was produced.

EXAMPLE 2

An initial melt mixture corresponding to 70 mole % In$_2$Te$_3$ and 30 mole % CdTe was prepared in the following manner. Ninety-five and two-tenths (95.2) grams of high-purity In$_2$Te$_3$ was mixed with 16.0 grams of CdTe, both compounds having been prepared and purified as discussed above. The mixture so prepared was sealed in a clean, evacuated fused silica ampoule approximately 19 mm in diameter. The sealed ampoule was lowered into a 76 mm bore vertical resistance heated furnace previously calibrated to provide a relatively flat thermal profile of 839° C. throughout the mixture heating and melting zone of the furnace. After the mixture had melted within the sealed ampoule, the ampoule was lowered through the thermal gradient section of the furnace, the thermal gradient being the same as in Example 1. The ampoule was lowered through the furnace at a rate of 0.60 mm/hr., so that the ampoule passed through the corresponding melting point of the mixture composition as indicated by line segment a-a' in the FIGURE. Self-seeded single crystal growth was thereby initiated at the dependent cone-shaped tip of the sealed ampoule and maintained at the 0.60 mm/hr. growth rate until completion at which point the remaining liquid melt composition rapidly solidified as a polycrystalline mass. The ampoule was slowly cooled, at a rate between about 0.5° C./hr. and 5° C./hr., to room temperature whereupon the crystal was removed from the ampoule. A high-quality single crystal of CdIn$_2$Te$_4$ having a diameter of approximately 16 mm was produced.

EXAMPLE 3

An initial melt mixture corresponding to 63 mole % In$_2$Te$_3$ and 37 mole % CdTe was prepared in the following manner. Four hundred eighty-five (485.0) grams of high-purity In$_2$Te$_3$ was mixed with 111.9 grams of CdTe, both compounds having been prepared and purified as discussed above. The mixture so prepared was sealed in a clean, evacuated fused silica ampoule approximately 50 mm in diameter. The sealed ampoule was lowered into a vertical resistance heated furnace previously calibrated to provide a relatively flat thermal profile of 900° C. throughout the mixture heating and melting zone of the furnace. After the mixture had melted within the sealed ampoule, the ampoule was lowered through the thermal gradient section of the furnace, the thermal gradient being the same as in Example 1. The ampoule was lowered through the furnace at a rate of 0.101 mm/hr. so that to lower the ampoule passed through the corresponding melting point of the mixture composition as indicated by line segment a-a' in the FIGURE. Self-seeded single crystal growth was thereby initiated at the dependent coneshaped tip of the sealed ampoule and maintained at the 0.101 mm/hr. growth rate until completion at which point the remaining liquid melt composition rapidly solidified as a polycrystalline mass. The ampoule was slowly cooled, at a rate between about 0.5° C./hr. and 5° C./hr., to room temperature whereupon the crystal was removed from the ampoule. A large, high-quality single crystal of CdIn$_2$Te$_4$ having a diameter of about 47 mm was produced.

What is claimed is:

1. A method for producing a large high-quality single crystal of CdIn$_2$Te$_4$, said method comprising the steps of:
   (a) preparing a mixture of high-purity cadmium, indium and tellurium corresponding to a mixture of from about 62 mole % to about 90 mole % In$_2$Te$_3$ and from about 38 mole % to about 10 mole % CdTe, respectively;
   (b) sealing said mixture in a clean evacuated ampoule, said ampoule having a dependent cone-shaped tip to initiate growth of a single crystal therein;
   (c) melting said mixture by heating said sealed ampoule to a temperature in excess of the melting point of said mixture; and
   (d) slowly cooling said melted mixture within said sealed ampoule through said melting point of said mixture to both initiate and maintain to completion the growth of a single crystal of CdIn$_2$Te$_4$ within said ampoule.

2. The method of claim 1 wherein the mole percentage of In$_2$Te$_3$ in said mixture is between about 62 mole % to about 72 mole %.

3. The method of claim 2 wherein the mole percentage of In$_2$Te$_3$ in said mixture is about 64 mole %.

4. The method of claim 1 wherein said melting point of said mixture is between about 785° C. to about 702° C.

5. The method of claim 1 wherein said ampoule is heated to a temperature between about 785° C. to about 900° C. to melt said mixture.

6. The method of claim 1 wherein said ampoule is heated in a vertical resistance-heated furnace.

7. The method of claim 6 wherein said resistance-heated furnace has about a 76 mm bore.

8. The method of claim 7 wherein said melted mixture is cooled through said melting point via a thermal gradient ranging between about 1.1° C./mm of furnace travel and about 3.5° C./mm of furnace travel in said resistance-heated furnace.

9. The method of claim 8 wherein the ampoule containing said melted mixture is lowered through said thermal gradient of said vertical resistance-heated furnace at a rate between about 0.05 mm/hr. to about 0.6 mm/hr.

10. The method of claim 1 wherein said dependent cone shaped tip of the crystal growth ampoule has been truncated and a seed crystal implanted within the ampoule at the point of truncation in order to permit seed-crystal-initiated crystal growth.

11. The method of claim 1 wherein the diameter of said ampoule prior to said dependent cone-shaped tip ranges between 19 to 55 mm.

12. A large high-quality single crystal of CdIn$_2$Te$_3$ produced by the method of claim 1.

13. A method for producing a large high-quality single crystal of CdIn$_2$Te$_4$, said method comprising the steps of:
   (a) preparing a mixture of high-purity Cd, In and Te, the relative content of Cd, In and Te corresponding in amount to that of a mixture of from about 62 mole % to about 90 mole % In$_2$Te$_3$ and from about 38 mole % to about 10 mole % CdTe, respectively;
   (b) sealing said mixture in a clean evacuated ampoule, said ampoule having a dependent cone-shaped tip to initiate growth of a single crystal therein;
   (c) melting said mixture by heating said sealed ampoule to a temperature in excess of the melting point of said mixture; and (d) slowly cooling said melted mixture within said sealed ampoule through said melting point of said mixture to both initiate and maintain to completion the growth of a single crystal of CdIn$_2$Te$_4$.

14. The method of claim 13 wherein the Cd, In and Te in said high purity mixture correspond in amounts to the relative content of Cd, In and Te in a mixture of In$_2$Te$_3$ and CdTe wherein 62 mole % to 75 mole % is In$_2$Te$_3$ and 38 mole % to 25 mole % is CdTe, respectively.

15. The method of claim 14 wherein the Cd, In and Te in said high purity mixture correspond in amounts to the relative content of Cd, In and Te in a mixture of In$_2$Te$_3$ and CdTe wherein about 64 mole % of the mixture in In$_2$Te$_3$.

16. The method of claim 13 wherein said melting point is between about 702° C. to about 785° C.

17. The method of claim 13 wherein said ampoule is heated to a temperature between about 785° C. to about 900° C. to melt said mixture.

18. The method of claim 13 wherein said ampoule is heated in a vertical resistance-heated furnace.

19. The method of claim 18 wherein said resistance-heated furnace has about a 76 mm bore.

20. The method of claim 19 wherein said melted mixture is cooled through said melting point via a thermal gradient ranging between about 1.1° C./mm of furnace travel and about 3.5° C./mm of furnace travel in said resistance-heated furnace.

21. The method of claim 20 wherein the ampoule containing said melted mixture is lowered through said thermal gradient of vertical resistance-heated furnace at a rate between about 0.05 mm/hr. to about 0.6 mm/hr.

22. The method of claim 13 wherein said dependent cone shaped tip of the crystal growth ampoule has been truncated and a seed crystal implanted within the ampoule at the point of truncation in order to permit seed-crystal-initiated crystal growth.

23. The method of claim 13 wherein the diameter of said ampoule prior to said dependent cone-shaped tip ranges between 19 to 55 mm.

24. A large high-quality single crystal of CdIn$_2$Te$_3$ produced by the method of claim 13.

25. A method for producing a large high-quality single crystal of CdIn$_2$Te$_4$, said method comprising the steps of:
(a) preparing a mixture of high-purity cadmium, indium and tellurium corresponding to a mixture of from about 62 mole % to about 90 mole % In$_2$Te$_3$ and from about 38 mole % to about 10 mole % CdTe, respectively;
(b) sealing said mixture in a clean evacuated fused silica ampoule, said ampoule having a diameter ranging between 19 mm to 50 mm, and a dependent cone-shaped tip to initiate growth of a single crystal therein;
(c) melting said mixture by heating said sealed ampoule in a vertical resistance-heated furnace to a temperature between about 785° C. and about 900° C.;
(d) slowly cooling said melted mixture within said sealed ampoule by lowering said mixture through its melting point, wherein said sealed ampoule is lowered through a temperature gradient ranging between 1.1° C./mm of furnace travel and about 3.5° C./mm of furnace travel in said resistance-heated furance at a rate of between about 0.05 mm/hr. to about 0.6 mm/hr. to both initiate and maintain to completion the growth of a single crystal of CdIn$_2$Te$_4$ within said ampoule, said melting point being at a temperature between about 785° C. to about 702° C.; and
(e) further cooling said single crystal to room temperature.

26. The method of claim 25 wherein said dependent cone shaped tip of the crystal growth ampoule has been truncated and a seed crystal implanted within the ampoule at the point of truncation in order to permit seed-crystal-initiated crystal growth.

27. A large high-quality single crystal of CdIn$_2$Te$_3$ produced by the method of claim 25.

* * * * *